United States Patent
Panzer et al.

(10) Patent No.: US 6,943,567 B2
(45) Date of Patent: Sep. 13, 2005

(54) METHOD FOR DETECTING THE OPERABILITY OF A NUMBER OF IDENTICAL ZENER DIODES THAT ARE CONNECTED IN PARALLEL TO ONE ANOTHER AND TO A SOLENOID

(75) Inventors: Karlheinz Panzer, Schwebheim (DE); Peter Hartmann, Lohr-Ruppertshütten (DE)

(73) Assignee: Bosch Rexroth AG, Lohr/Main (DE)

( * ) Notice: Subject to any disclaimer, the term of this patent is extended or adjusted under 35 U.S.C. 154(b) by 0 days.

(21) Appl. No.: 10/495,813
(22) PCT Filed: Nov. 16, 2002
(86) PCT No.: PCT/EP02/12860
§ 371 (c)(1),
(2), (4) Date: Nov. 24, 2004
(87) PCT Pub. No.: WO03/046588
PCT Pub. Date: Jun. 5, 2003

(65) Prior Publication Data
US 2005/0083070 A1 Apr. 21, 2005

(30) Foreign Application Priority Data
Nov. 30, 2001 (DE) ......................................... 101 58 869

(51) Int. Cl.⁷ ............................................. G01R 27/26
(52) U.S. Cl. ....................... 324/675; 324/691; 324/767; 324/658
(58) Field of Search ........................... 307/30; 324/110, 324/658, 675, 691, 767; 327/194; 340/635, 645; 361/8

(56) References Cited
U.S. PATENT DOCUMENTS
6,222,441 B1 * 4/2001 Siegwarth .............. 340/310.02

FOREIGN PATENT DOCUMENTS
DE 1235423 3/1967
DE 120721 6/1976
DE 3917706 10/1990

OTHER PUBLICATIONS

Simulation and Modeling, by Saleh et al., Circuits and Devices, IEEE, Mar. 1993.*

"Surge/Noise Suppression Within Electrical Connectors", Eric J Paulus, May 1–4, 1994, New York, vol. Conf. 44, pp. 239–247.

"Low Current and Capacitance Measurement Technique", El–Kareh and J. Zauchner, Nov. 1, 1975, New York, vol. 18 No. 6, pp. 1782–1783.

* cited by examiner

Primary Examiner—Jay Patidar
Assistant Examiner—Walter Benson
(74) Attorney, Agent, or Firm—Martin A. Farber

(57) ABSTRACT

When using solenoid coils in an explosion-hazard environment, in order that no sparks are produced in the event of a discontinuity in an electrical line leading to the solenoid coil, two or more identical zener diodes are connected in parallel with one another and to the solenoid coil. In order to verify the operability of all the zener diodes which are connected in parallel with one another and to the solenoid coil, the electrical values of the zener diodes and of the solenoid coil are measured before assembly. The total capacitance of the circuit arrangement is measured after assembly. The capacitance of the solenoid coil is subtracted from the total capacitance, and the remaining value is divided by the number of parallel-connected zener diodes. The result is compared with the capacitance of a single zener diode, with the magnitude of the difference between these values being used as a criterion for the operability of the zener diodes.

3 Claims, 2 Drawing Sheets

Figure 1:
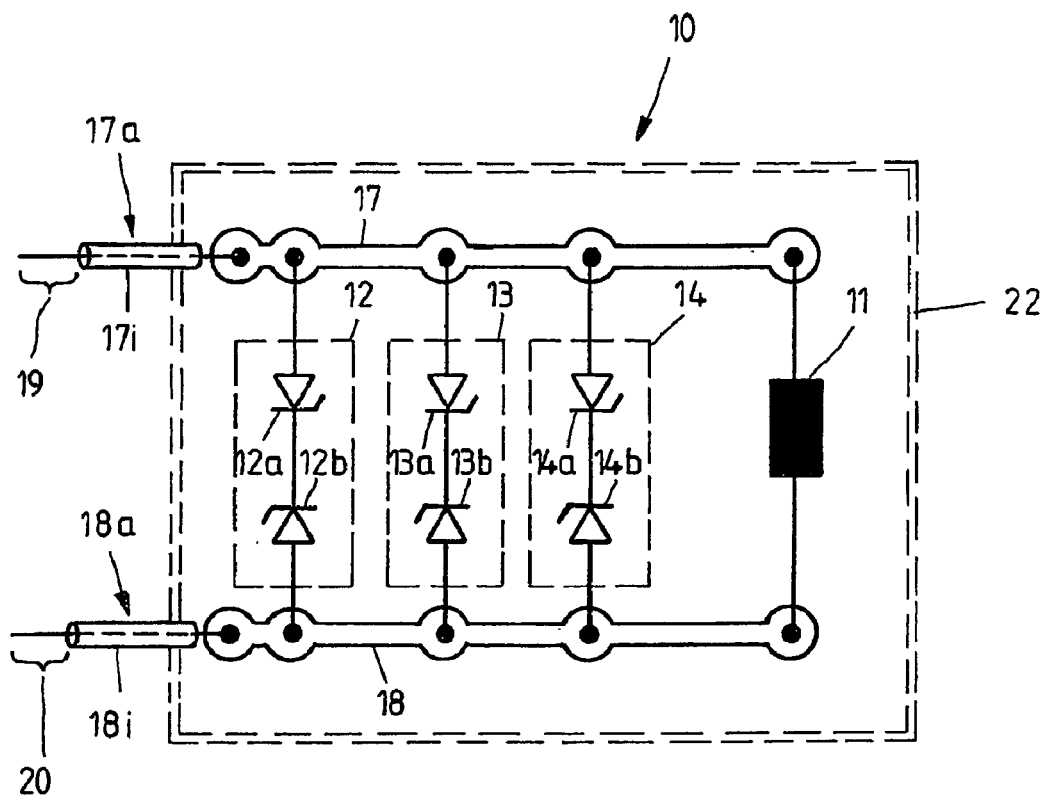

METHOD FOR DETECTING THE OPERABILITY OF A NUMBER OF IDENTICAL ZENER DIODES THAT ARE CONNECTED IN PARALLEL TO ONE ANOTHER AND TO A SOLENOID

FIELD AND BACKGROUND OF THE INVENTION

The invention relates to a method for verification of the operability of two or more identical zener diodes which are connected in parallel with one another and are connected to a solenoid coil.

Electrically operated hydraulic or pneumatic valves control a hydraulic or pneumatic working medium depending on the magnitude of an electrical input signal. The electrical input signal is supplied to a solenoid coil, which deflects an armature as a function of the current flowing via the solenoid coil. If valves such as these are used in an explosion-hazard environment, particular safety regulations apply. These regulations require, inter alia, that, in the event of a discontinuity in a line leading to the solenoid coil, the induction voltage that is produced in this case is limited to a safe value. The aim of this is to prevent spark formation, which could cause explosive gases to explode. Two or three zener diodes are connected in parallel with a solenoid coil in order to limit the induction voltage that occurs in the event of a cable discontinuity, in accordance with the applicable regulations for explosion proof equipment. In order to limit the induction voltage irrespective of its polarity, two zener diodes are used, for example, connected in series in opposite senses. As an alternative to this, bidirectional zener diodes may also be used, which correspond to two single zener diodes, connected in series in opposite senses. The zener diodes are arranged physically as close as possible to the solenoid coil. In accordance with the safety regulations, the parallel circuit that is formed from the zener diodes and the solenoid coil is additionally encapsulated by means of an insulating compound. The encapsulated circuit forms an electrical two-pole network, from which only the two connecting lines lead to the exterior. Only the two connecting lines of the two-pole network are therefore available as measurement points for testing the operability of the zener diodes which are connected in parallel with the solenoid coil. It is not possible to test the operability of the zener diodes individually after they have been soldered into the circuit arrangement and have been encapsulated.

SUMMARY OF THE INVENTION

The invention is based on the object of specifying a method which makes it possible to test the operability of zener diodes which are arranged in parallel with a solenoid coil and are encapsulated together with it.

The method according to the invention is based on determining the capacitance of the zener diodes by determining the total capacitance of the encapsulated two-pole network taking into account the electrical values of the solenoid coil, in particular its parasitic capacitance. The capacitance of a zener diode comprises the depletion layer capacitance and the diffusion capacitance. Of these capacitances, the depletion layer capacitance is the dominant factor for the method according to the invention. Defective zener diodes have either a short circuit or an interruption, and they therefore have no measurable capacitance. The method according to the invention admittedly does not make it possible to determine which zener diode is not operable in the event of a fault. There is no need for this either since all that needs to be tested in this case is whether all of the zener diodes are operable. If one of the zener diodes is not operable in the event of a fault, for example because it has not been soldered in correctly or because it has been damaged during soldering it in or during the subsequent encapsulation process, the circuit cannot be used. In this case, it is irrelevant which of the zener diodes is not operable in this situation.

Advantageous developments of the method according to the invention are characterized in the dependent claims. The capacitance of the depletion layer of the zener diodes can be evaluated in various ways. In one case of the method, the total capacitance of the two-pole network that is formed from the zener diodes and the solenoid coil is measured. This comprises the sum of the capacitances of the depletion layers of the individual zener diodes, and the capacitance of the solenoid coil. In order to avoid the inductance of the solenoid coil that is connected in parallel with the zener diodes corrupting the measurement result, the measurement frequency is chosen to be sufficiently high that the inductance of the solenoid coil effectively no longer has any influence on the result of the capacitance measurement. If the measurement frequency values are high, the impedance of the inductance of the solenoid coil connected in parallel with the zener diodes is very large, and thus acts in the same way as a discontinuity in the connection between the two connecting lines. A capacitance measurement device with a high measurement frequency in the order of magnitude 1 MHz or more is therefore required for this method. However, measurement devices such as these are very expensive. In another case of the method the inductance of the solenoid coil and the resonant frequency of the resonant circuit which is formed from the solenoid coil and the parallel-connected zener diodes are measured. The total capacitance of the two-pole network is calculated from these values, and the capacitance of the solenoid coil is subtracted from this. The result is compared with the value obtained from the measurement of the individual zener diodes before assembly. This method has the advantage that there is no need to provide any measurement devices with such a high measurement frequency for determination of the total capacitance, as in the case if the capacitance of the depletion layer of the zener diodes is measured directly.

Figure 2:
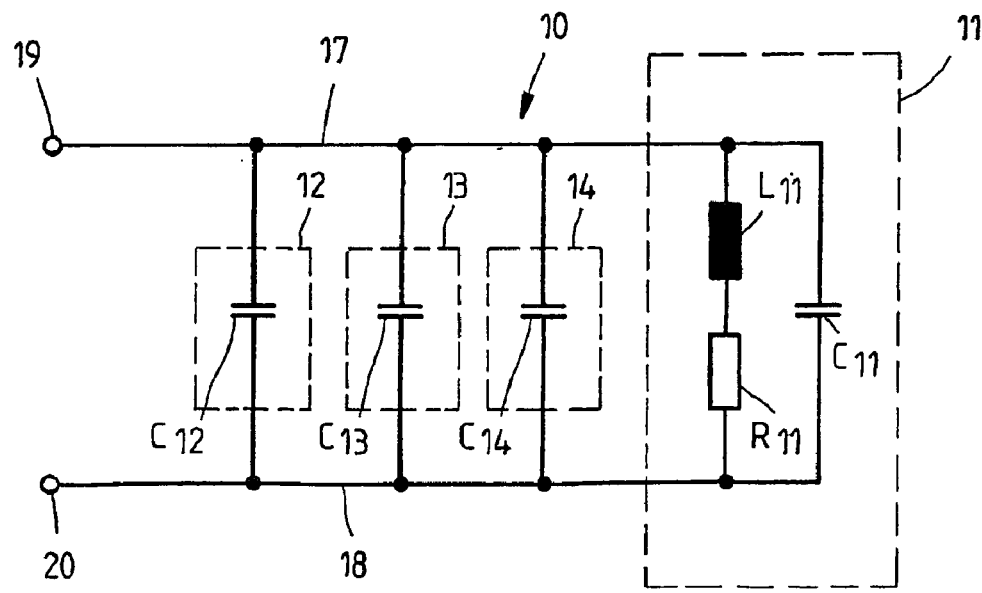
Figure 3:
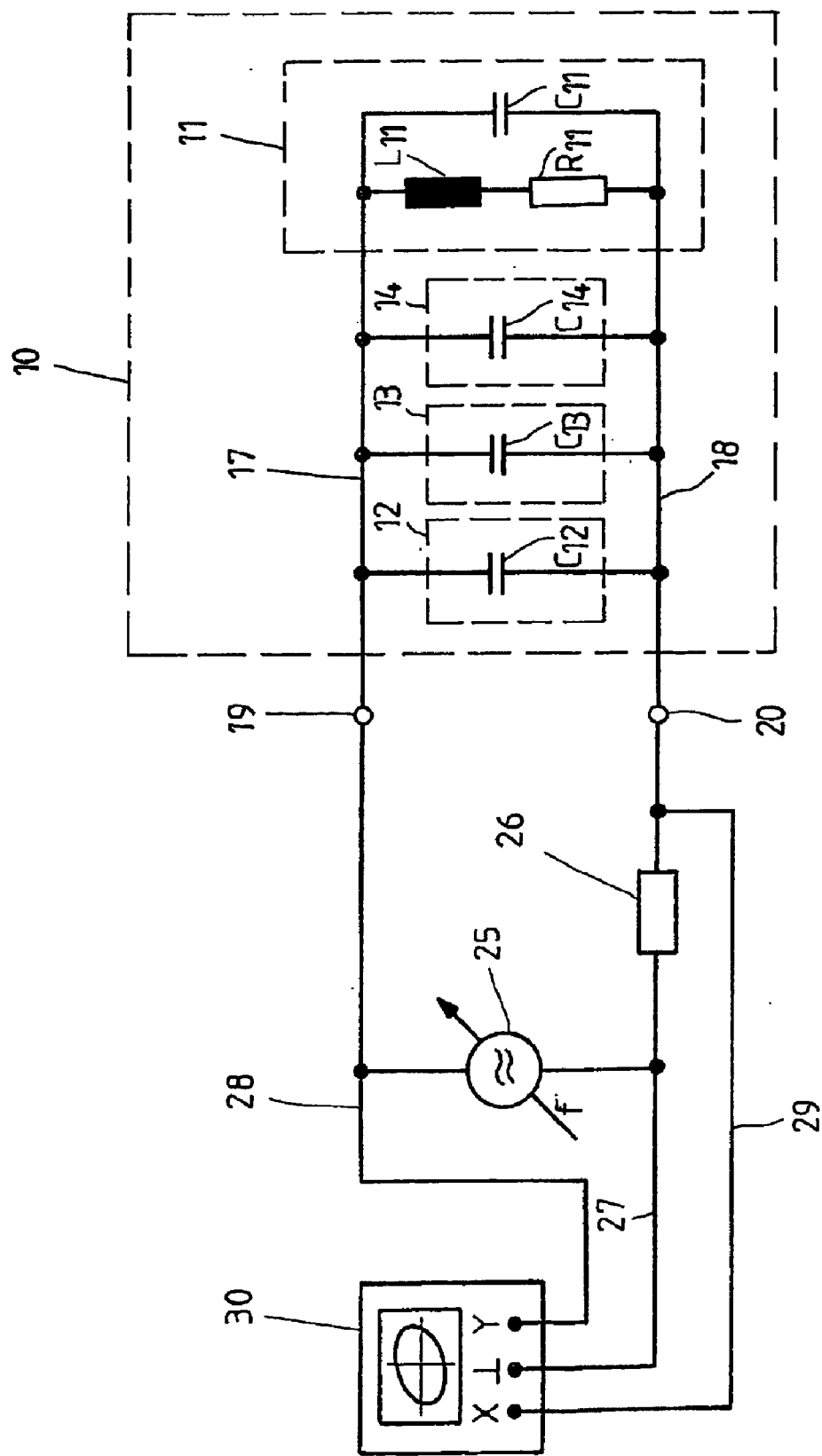

The method according to the invention will be explained in more detail in the following text, together with its further details, on the basis of two electrical circuit diagrams that are illustrated in the drawings, in which:

FIG. 1 shows a circuit diagram of an electrical circuit arrangement in the form of a two-pole network, which is formed from a solenoid coil and three bidirectional zener diodes connected in parallel with it, FIG. 2 shows an electrical equivalent circuit of the circuit illustrated in FIG. 1, and FIG. 3 shows the circuit diagram of an arrangement for determining the resonant frequency of the circuit arrangement that is illustrated in FIGS. 1 and 2.

DETAILED DESCRIPTION OF THE PREFERRED EMBODIMENT

FIG. 1 shows the circuit diagram of an electrical circuit arrangement 10 in the form of a two-pole network. This comprises a solenoid coil 11 as well as three bidirectional zener diodes 12, 13 and 14, which are connected in parallel to the solenoid coil 11. One connection of each of these electrical components is soldered to one of two conductor tracks 17 or 18. Flexible electrical connecting lines 17a and 18a, respectively, are soldered to the conductor tracks 17 and 18 and are used for connection of the circuit arrangement 10 to a control centre which is not illustrated in the figures but which applies current to the solenoid coil 11 during operation. The braids of the connecting lines 17a and 18a are provided with electrical insulation 17i and 18i, respectively, which is removed only at the free ends, which are annotated by the reference symbols 19 and 20. The circuit arrangement is encapsulated by means of an electrically insulating plastic to form a block 22, from which only the insulated connecting lines 17a and 18a project. The bidirectional zener diodes 12 to 14 are electrical components which each correspond to two identical, single zener diodes, which are connected to one another. The junction point between the individual zener diodes is, however, not accessible. A bidirectional zener diode limits a voltage that is applied to it irrespective of the current direction to a value which is equal to the sum of the limiting voltage of the first zener diode and the forward voltage of the respective other zener diode, providing that the magnitude of the voltage that is supplied is greater than the sum of the forward voltage is greater than the sum of the breakdown voltage and the forward voltage of the zener diodes which are connected to one another. FIG. 1 shows the two zener diodes of a bidirectional zener diode by means of the letters a or b that are attached to the reference symbol for the respective bidirectional zener diode.

FIG. 2 shows an electrical equivalent circuit of the circuit that is illustrated in FIG. 1. The solenoid coil 11 is illustrated as a parallel circuit formed by a capacitance $C_{11}$ and a series circuit formed by an inductance $L_{11}$ and a resistance $R_{11}$. The resistance of the winding of the solenoid coil 11 is included in the resistance $R_{11}$. The capacitive component of the solenoid coil 11 is included in the capacitance $C_{11}$. The bidirectional zener diodes 12, 13 and 14 are illustrated in the equivalent circuit as capacitors with the capacitances $C_{12}$, $C_{13}$ and $C_{14}$, respectively. The capacitances $C_{12}$, $C_{13}$ and $C_{14}$ are in each case formed from the series circuits formed by the depletion layer capacitances of the two zener diodes 12a and 12b, 13a and 13b as well as 14a and 14b, which are connected to one another. Since, as already stated, the bidirectional zener diodes 12 to 14 are electrical components in the form of a two-pole network, only the resultant capacitances $C_{12}$, $C_{13}$ and $C_{14}$ can be measured. The total capacitance of the circuit arrangement 10 is annotated $C_{tot}$. This is obtained from $C_{tot}=C_{12}+C_{13}+C_{14}+C_{11}$. The electrical values of the circuit arrangement 10 are measured via the connections 19 and 20.

The method according to the invention is based on the evaluation of the depletion layer capacitance of the bidirectional zener diodes 12 to 14. The total capacitance $C_{tot}$ of the circuit arrangement 10 is formed from the sum of the capacitances $C_{12}$, $C_{13}$ and $C_{14}$, as well as the capacitance $C_{11}$ of the solenoid coil 11. On the assumption that the capacitances $C_{12}$, $C_{13}$, $C_{14}$ of the three bidirectional zener diodes 12 to 14 are each virtually the same, all three parallel-connected bidirectional zener diodes 12 to 14 are operable when the total capacitance $C_{tot}$ of the circuit arrangement 10 minus the capacitance $C_{11}$ of the solenoid coil 11 is equal to three times the value of the capacitance of one bidirectional zener diode. If one of the zener diodes 12 to 14 is not operable, for example because it has not been soldered in correctly or because it has been damaged while being soldered in or during the encapsulation process, the total capacitance $C_{tot}$ of the circuit arrangement 10 is reduced by the capacitance of one zener diode. If two zener diodes are not operable, the total capacitance $C_{tot}$ of the circuit arrangement 10 is reduced by twice the value of the capacitance of one zener diode. The capacitance $C_{11}$, the inductance $L_{11}$ and the resistance $R_{11}$ must be taken into account when determining the total capacitance, $C_{tot}$.

Two variants of the process for determining the total capacitance $C_{tot}$ of the circuit arrangement 10 will be described in the following text. In both cases, the electrical values of the individual components are measured before they are soldered in. The values of the capacitances $C_{12}$, $C_{13}$, $C_{14}$ of the bidirectional zener diodes 12, 13, 14 as well as the inductance $L_{11}$, the resistance $R_{11}$ and the capacitance $C_{11}$ of the solenoid coil 11 before being soldered in are required for the subsequent evaluation of the measurements on the encapsulated circuit arrangement 10. The amplitude and the frequency of the AC voltages which are used for measurement of the electrical values of the components before they are soldered in are in this case chosen to be equal to those which are used for measurement of the electrical values on the encapsulated circuit arrangement. In order to prevent the zener diodes from operating during the measurement process, the amplitude of the measurement voltage is chosen to be less than the response voltage of the zener diodes.

In the first variant for determination of the total capacitance $C_{tot}$ of the circuit arrangement 10, the measurement is carried out using a capacitance measurement device whose input is connected to the connections 19 and 20 of the circuit arrangement 10. In this case, a capacitance measurement device with a high measurement frequency in the order of magnitude of 1 MHz or more is required, in order to ensure that the influence of the inductance $L_{11}$ on the measurement result is negligibly small. When the measurement frequency is high, the impedance of the solenoid coil 11 which is connected to the conductor tracks 17 and 18 is very large, so that the inductance $L_{11}$ acts in the same way as a discontinuity in the connection between the conductor tracks 17 and 18. The capacitance $C_{11}$ of the solenoid coil 11 measured before the components are soldered into the circuit arrangement 10 is subtracted from the value of the total capacitance $C_{tot}$ of the circuit arrangement 10 determined in this way, and the result is divided by the number of bidirectional zener diodes connected in parallel to the solenoid coil, and is compared with the capacitance of one bidirectional zener diode measured before the components are soldered into the circuit arrangement 10. If the discrepancy is equal to zero or is within a permissible tolerance band, all of the parallel-connected zener diodes are operable. If the discrepancies are greater, at least one zener diode is not operable.

Capacitance measurement devices with a high measurement frequency are expensive. If no such capacitance measurement device is available, for example for cost reasons, the total capacitance $C_{tot}$ can also be determined in a different way, as described in the following text. In this variant of the method according to the invention, use is made of the idea that the total capacitance $C_{tot}$ of the circuit arrangement 10, the resistance $R_{11}$ and the inductance $L_{11}$ form a resonant circuit. FIG. 3 illustrates a circuit arrangement for determining the resonant frequency (which is annotated $f_0$) of the resonant circuit. A frequency generator 25 is connected via a non-reactive resistance 26 to the connections 19 and 20 of the circuit arrangement 10. The frequency f of the frequency generator 25 can be set within a frequency range which includes the resonant frequency $f_0$. The output voltage from the frequency generator 25 and the voltage which is dropped across the resistance 26 are supplied via lines 27, 28 and 29 to the inputs of an oscilloscope 30. The voltage which is dropped across the resistance 26 is a measure of the current flowing via the circuit arrangement 10. The potential on the line 27 is used as a reference ground potential. The output voltage from the frequency generator 25 is supplied via the line 28 to the connection, which is annotated by the letter Y, for the vertical deflection of the oscilloscope 30. The voltage which is dropped across the resistance 26 is supplied via the line 29 to the connection, which is annotated with the letter X, for the horizontal deflection of the oscilloscope 30. If the frequency f of the frequency generator 25 differs from the resonant frequency $f_0$, there is a phase shift between the voltages supplied to the inputs X and Y of the oscilloscope 30. The frequency f of the frequency generator 25 is now varied until the voltage which has dropped across the resistance 26 is in phase with the output voltage from the frequency generator 25. This frequency is the resonant frequency $f_0$. The total capacitance $C_{tot}$ of the circuit arrangement 10 is calculated from the values of the frequency $f_0$, the inductance $L_{11}$ and the resistance $R_{11}$ using the relationships which are applicable to RLC resonant circuits. The capacitance $C_{11}$ of the solenoid coil 11 is subtracted from this value, and the result is divided by the number of parallel-connected bidirectional zener diodes. The result of this calculation is compared with the capacitance of a bidirectional zener diode measured before the components are soldered into the circuit arrangement 10. If the discrepancy is equal to zero or is within a permissible tolerance band, all of the parallel-connected zener diodes are operable. In the event of larger discrepancies, at least one zener diode is not operable. In this variant of the method according to the invention, a measurement frequency in the order of magnitude of 10 kHz is adequate. This measurement frequency is two orders of magnitude less than the measurement frequency required for the first variant.

The method according to the invention admittedly in principle makes it possible to test the operability of a single zener diode which is connected in parallel with the solenoid coil. However, since two or more zener diodes must in each case be arranged in parallel with one another in practice, for safety reasons, it is not permissible to use circuits in which only a single zener diode is connected in parallel with the solenoid coil.

What is claimed is:

1. A method for verification of the operability of two or more identical zener diodes which are connected in parallel with one another and are connected in a circuit to a solenoid coil, the method comprising a first step of measuring the electrical values of the zener diodes (12, 13, 14) and of the solenoid coil (11) before assembly of the circuit, and, after assembly of the circuit, a second step of measuring the total capacitance ($C_{tot}$) of the parallel circuit (10) that is formed from the solenoid coil (11) and the zener diodes (12, 13, 14), wherein, in the method, the capacitance ($C_{11}$) of the solenoid coil (11) is subtracted from the total capacitance ($C_{tot}$), and the remaining value is divided by the number of zener diodes (12, 13, 14), and the result of this calculation is compared with the capacitance ($C_{12}$, $C_{13}$, $C_{14}$) of an individual zener diode (12, 13, 14), with the difference between these values being used as a criterion for the operability of the zener diodes.

2. The method as claimed in claim 1, wherein the measurement of the total capacitance ($C_{tot}$) of the parallel circuit (10) is carried out using an AC voltage, whose frequency is chosen to be sufficiently large that the influence of the inductance ($L_{11}$) of the solenoid coil (11) on the measurement result is negligibly small.

3. The method as claimed in claim 1, wherein, in order to determine the total capacitance ($C_{tot}$), the resonant frequency ($F_0$) of the resonant circuit (11, 12, 13, 14) which is formed from the solenoid coil (11) and the zener diodes (12, 13, 14) is measured, and the total capacitance ($C_{tot}$) is calculated from the resonant frequency ($F_0$) and the inductance ($L_{11}$) of the solenoid coil (11) as well as its resistance ($R_{11}$).

* * * * *